(12) United States Patent
Kim

(10) Patent No.: US 8,288,660 B2
(45) Date of Patent: Oct. 16, 2012

(54) PRESERVING STOPBAND CHARACTERISTICS OF ELECTROMAGNETIC BANDGAP STRUCTURES IN CIRCUIT BOARDS

(75) Inventor: Tae Hong Kim, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 787 days.

(21) Appl. No.: 12/244,854

(22) Filed: Oct. 3, 2008

(65) Prior Publication Data

US 2010/0084176 A1 Apr. 8, 2010

(51) Int. Cl.
*H05K 1/11* (2006.01)
(52) U.S. Cl. ........ 174/261; 361/792; 361/793; 361/794; 361/795
(58) Field of Classification Search .......... 361/792–795; 343/909, 795; 174/261–266
See application file for complete search history.

(56) References Cited

U.S. PATENT DOCUMENTS

| | | | |
|---|---|---|---|
| 6,483,480 B1 * | 11/2002 | Sievenpiper et al. | 343/909 |
| 6,917,343 B2 * | 7/2005 | Sanchez et al. | 343/795 |
| 6,943,650 B2 | 9/2005 | Ramprasad et al. | |
| 7,123,118 B2 | 10/2006 | McKinzie, III | |
| 7,215,301 B2 | 5/2007 | Choi et al. | |
| 7,253,788 B2 | 8/2007 | Choi et al. | |
| 2003/0122729 A1 * | 7/2003 | Diaz et al. | 343/909 |
| 2004/0239451 A1 * | 12/2004 | Ramprasad et al. | 333/202 |
| 2005/0194169 A1 * | 9/2005 | Tonomura | 174/35 R |
| 2005/0224912 A1 * | 10/2005 | Rogers et al. | 257/532 |
| 2006/0050010 A1 * | 3/2006 | Choi et al. | 343/909 |
| 2006/0092093 A1 * | 5/2006 | Choi et al. | 343/909 |
| 2007/0018757 A1 * | 1/2007 | McKinzie, III | 333/219 |
| 2007/0159401 A1 * | 7/2007 | Baliarda et al. | 343/702 |
| 2007/0257853 A1 * | 11/2007 | Gevorgian et al. | 343/787 |
| 2008/0091389 A1 | 4/2008 | Kim et al. | |

FOREIGN PATENT DOCUMENTS

| | | |
|---|---|---|
| CN | 1874052 A | 12/2006 |
| CN | 1874053 A | 12/2006 |

OTHER PUBLICATIONS

Makinen R., "Highly Miniaturized Electromagnetic Band-gap Structures for Hand-Held Devises", Application No. 9483254, Pbl. 2006, 1 page.

Editor. Kai Chang, Texas A&M University, "Microwave and Optical Technology Letters" Author: Peng Zhou et al. vol. 49 / No. 1, Jan. 2007, 5 pages.

Peng Z., "A Self-Similar Fractal Electromagnetic Band-Gap Structure in the Power Plane with Braadband Suppression of Ground Bounce Noise", Application No. 9260631, Pbl. Jan. 2007, pp. 190-192.

* cited by examiner

*Primary Examiner* — Timothy Thompson
*Assistant Examiner* — Sherman Ng
(74) *Attorney, Agent, or Firm* — Cynthia G. Seal; Jeffrey L. Streets

(57) ABSTRACT

The stopband characteristics of an electromagnetic bandgap structure in a printed circuit board may be preserved by selectively forming slots in an additional conductive layer of the printed circuit board. For example, an electromagnetic bandgap structure may include a layer with a continuous conductive region and another layer with a periodically patterned region having a plurality of spaced-apart patches interconnected by branches. Additional conductive layers may be included within the printed circuit board without neutralizing the bandgap by forming slots in the conductive layers in general alignment with spaces between the patches.

18 Claims, 5 Drawing Sheets

PRESERVING STOPBAND CHARACTERISTICS OF ELECTROMAGNETIC BANDGAP STRUCTURES IN CIRCUIT BOARDS

BACKGROUND OF THE INVENTION

1. Field of the Invention

The present invention relates to noise suppression and isolation in electronic systems, and in particular, to maintaining stopband characteristics of an electromagnetic bandgap structure in a circuit board having multiple conductive layers.

2. Background of the Related Art

In modern high-speed and mixed-signal electronic systems, isolating power/ground noise coupling between circuits on a printed circuit board ("PCB") is a challenge. If not controlled or accounted for, the noise coupling between circuits may result, for example, in false switching for digital circuits and malfunctioning of analog circuits.

One approach to suppressing noise coupling is to provide a split power/ground plane. However, the split power/ground plane requires the use of multiple DC power supplies, which increases cost. Another approach to suppressing noise coupling in electronic circuits is the use of periodically patterned structures, such as electromagnetic bandgap ("EBG") structures. EBG structures exhibit stopband properties tending to prevent or reduce electromagnetic propagation in the range of stopband frequencies. Unlike the use of a split power/ground plane, EBG structures can be used with circuits sharing a common power supply.

In a conventional EBG structure, a periodically patterned structure is provided in one layer (e.g. in a power plane) of a PCB, and a solid metal layer is provided in another layer (e.g. in a ground plane). The solid metal layer is spaced from the patterned layer, typically by a single substrate layer. Together, the periodically patterned layer and the solid metal layer create a noise filter. However, options for including additional conductive layers in the PCB along with an EBG structure are conventionally limited, because the total electrical characteristics of the EBG structure would be changed by the presence of an additional solid metal layer above the patterned layer. In particular, the stopband characteristic of the EBG structure would be diminished similar to the manner in which a microstripline would be nullified by the presence of another ground plane above it.

BRIEF SUMMARY OF THE INVENTION

One embodiment of the present invention provides a circuit board with multiple layers. A first conductive layer has a substantially continuous region. A second conductive layer is spaced from the first conductive layer with a dielectric material between the first and second conductive layers. The second conductive layer has a periodically patterned region that includes a plurality of spaced-apart conductive patches interconnected by conductive branches. The substantially continuous region of the first layer spans at least the periodically patterned region of the second layer. A third conductive layer is spaced from the second conductive layer in a direction away from the first conductive layer, with a dielectric material between the second and third conductive layers. The third conductive layer has a slotted region including slots aligned with spaces between the patches in the periodically patterned region. Another embodiment is directed to a method of manufacturing such a circuit board.

DETAILED DESCRIPTION OF THE INVENTION

The present invention is directed, in part, to preserving the stopband characteristics of an EBG structure in a multi-layered PCB, by providing slots at selected locations of an otherwise solid metal layer. The invention may be embodied, for example, as a multi-layer PCB having an EBG structure, and a method of manufacturing the multi-layer PCB. In one embodiment, the EBG structure includes a first conductive layer having a substantially continuous region and a second conductive layer having a periodically patterned region, separated by a dielectric layer. The first conductive layer may be in a ground plane (i.e. the ground layer) and the second conductive layer may be in a power plane (i.e. the power layer). Semiconductor devices or circuits in another layer are coupled to different patches in the periodically patterned region of the second conductive layer. The EBG structure provides stopband that shields circuits coupled to different patches from power/ground noise interference. A third conductive layer, such as an additional ground or power layer, may be included in the PCB. The stopband is preserved by providing a slotted region in the third conductive layer, having slots aligned with the spaces between the patches in the periodically patterned region of the second conductive layer.

Figure 1:
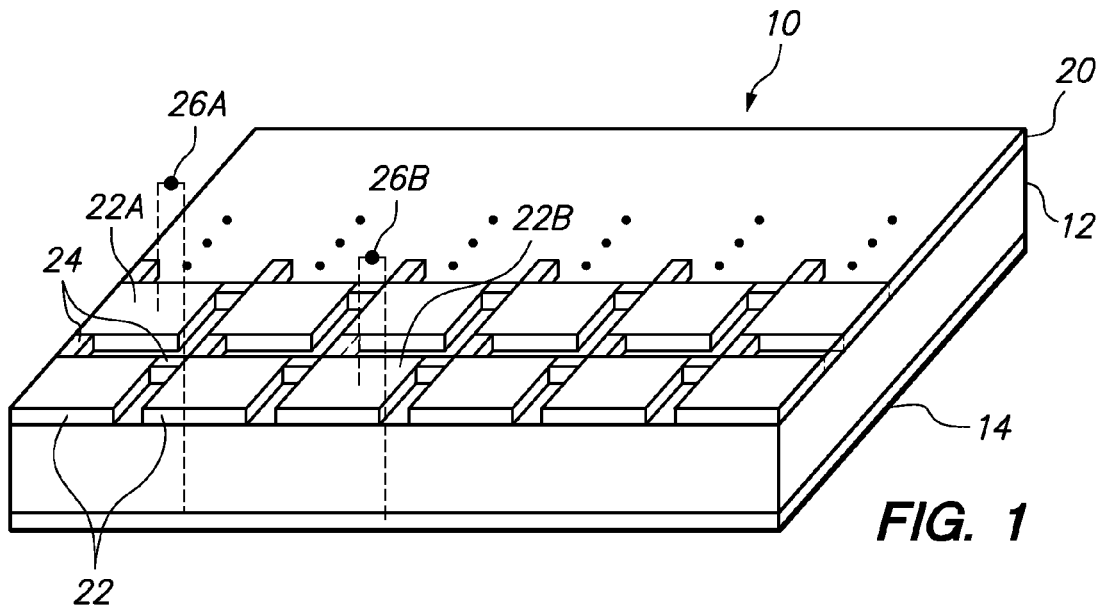
FIG. 1 is a perspective view of a rectangular section of an EBG structure having a first conductive layer with a continuous region and a second layer with a periodically patterned region.

FIG. 1 is a perspective view of a rectangular section of an EBG structure 10. The EBG structure 10 may be manufactured, at least in part, according to techniques used to manufacture multi-layered printed circuit boards (PCBs). The EBG structure 10 includes a first conductive layer 14, a second conductive layer 20, and a dielectric layer 12 between the first and second conductive layers 14, 20. The region of the first conductive layer 14 within the illustrated section of the EBG structure 10 is continuous, and may be a solid metal layer. The region of the second conductive layer 20 within the illustrated section of the EBG structure 10 is periodically patterned, rather than continuous. This periodically patterned region includes an array of spaced-apart patches 22 interconnected by branches 24. The patches 22 and branches 24 may be formed, for example, by etching the second conductive layer 20 according to a subtractive process. Alternatively, the patches 22 and branches 24 may be formed in an additive process, wherein the patches 22 and branches 24 are plated onto the dielectric layer 12 without the need for etching. The continuous region of the first conductive layer 14 spans at least the periodically patterned region of the second conductive layer 20. Beyond the illustrated section of the EBG structure 10, the composition of the layers may vary. Thus, for example, the entire first conductive layer 14 need not be continuous, and the entire second conductive layer 20 need not be periodically patterned.

The first conductive layer 14 may be provided either in a ground plane or a power plane. The second conductive layer 20 may also be provided in either a ground plane or a power plane. For example, the first conductive layer 14 is typically provided in a ground plane, in which case the second conductive layer 20 may be provided in a power plane. Alternatively, if the first conductive layer 14 is provided in the power plane, the second conductive layer 20 may be provided in the ground plane. Typically, the first and second conductive layers 14, 20 will each be formed of metal or metal alloy, due to the generally good electrical conductivity of many metals and metal alloys. For example, the conductive layers 14, 20 can include a metal such as aluminum (Al), chromium (Cr), copper (Cu), palladium (Pd), platinum (Pt), or combinations thereof. However, it is within the scope of the invention for conductive layers to alternatively be formed of an electrically-conductive material, either presently known or future-developed, other than a pure metal or metal alloy. The first and second conductive layers 14, 20 may be formed in any of a range of thicknesses, and can be made as thin as manufacturing techniques allow, with conductive layers as thin as 17 μm being presently achievable in many applications.

The region of the dielectric layer 12 in the illustrated section of the bandgap structure 10 is a continuous dielectric material, which acts as an electrical insulator between the illustrated regions of the first conductive layer 14 and the second conductive layer 20. The dielectric layer 12 may be formed of any of a variety of dielectric materials known in the art of PCB manufacturing. The dielectric layer 12 can include, for example, FR-4 ("Flame Retardant 4"), ceramic, and combinations thereof. The dielectric layer 12 can be as thin as manufacturing technology allows. The EBG structure 10 may be cured using a combination of temperature and pressure that causes the glass fibers in the dielectric layer to soften and bond together for strength and rigidity.

Figure 2:
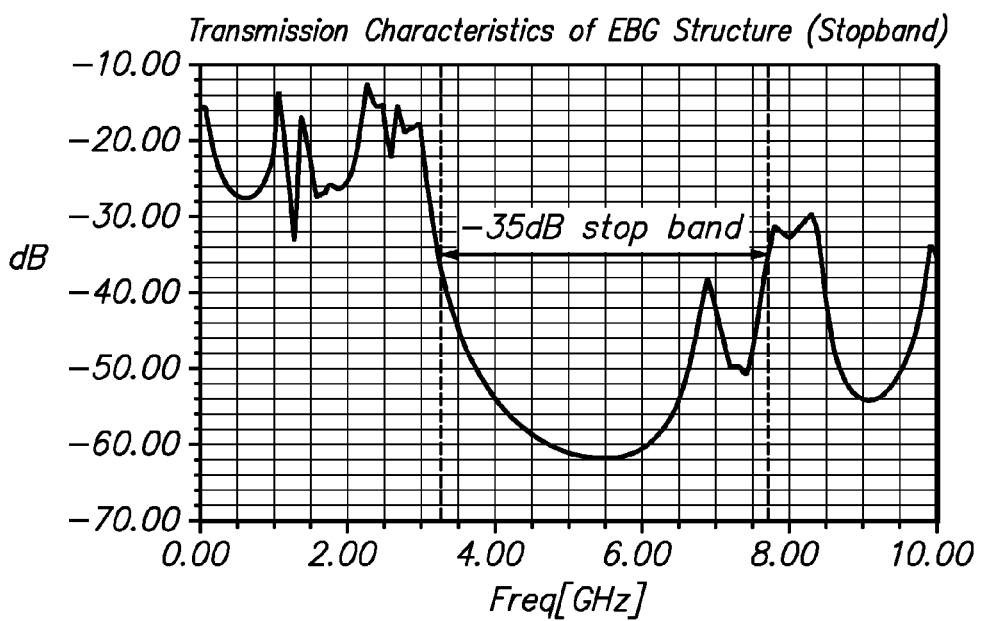
FIG. 2 is a graph showing the transmission characteristic of the EBG structure 10 in FIG. 1, which includes stopband.

In the periodically patterned region of the second conductive layer 20, the difference in surface area of the relatively large patches 22 as compared with the relatively small branches 24 imparts alternating sections of high and low characteristic impedances. In particular, each patch 22 in the second conductive layer 20 in combination with the continuous region of the first conductive layer 14 forms a parallel-plate waveguide having comparatively lower characteristic impedance than a parallel-plate waveguide formed by each branch 24 in the second conductive layer 20 in combination with the continuous region of the first conductive layer 14. Thus, the alternating patches 22 and branches 24 form a two-dimensional LC (inductor-capacitance) network that serve as a low-pass filter (LPF) having a characteristic stopband, to isolate electromagnetic waves between circuits that are in electronic communication with the patches 22 of the EBG structure 10. A stopband is a band of frequencies between specified limits in which electromagnetic wave propagation is prohibited. (or the amplitude of those frequencies is significantly reduced to below a threshold value. FIG. 2 is a graph showing the transmission characteristic of the EBG structure 10 in FIG. 1, including the stopband.

Referring again to FIG. 1, various design considerations will affect the characteristics of the stopband of the EBG structure 10. Although not strictly required, the patches 22 in this embodiment of the EBG structure 10 are arranged in a rectangular array of evenly spaced patches in an x-y plane. Thus, the vertical (y) spacing between two vertically spaced patches 22 is the same as the horizontal (x) spacing between two horizontally spaced patches 22. The patches 22 have a rectangular shape, although other patch shapes may be selected, such as a polygonal shape, a hexagonal shape, a triangular shape, or a circular shape. The size and shape of the patches 22 affects the stopband. Generally, increasing the surface area (in the x-y plane) of each patch 22 will shift the stopband to a lower band of frequencies. Varying the dielectric material will also result in a different frequency or stopband shift, assuming the same patch and branch parameters. Also, some stopband deviation may occur due to structural differences among different devices. For example, the positioning and quantity of via clearances in a circuit board may affect the resulting stopband of the EBG structure.

The stopband generated by the EBG structure 10 (see FIG. 2) provides noise suppression for semiconductor devices, including both analog and digital circuits. Noise suppression is particularly desirable in "mixed-signal" systems, which include both analog and digital circuits on the same circuit board. Digital circuits are often noisy, while analog circuits can be very sensitive to noise. For instance, radio frequency (RF) front-end circuits such as low noise amplifiers are configured to detect low-power signals, and consequently are very sensitive. A large noise spike in or near the operating frequency band of a sensitive analog circuit can desensitize the circuit or undermine its functionality.

The LPF characteristic of the EBG structure 10 is useful for isolating circuits, and in particular, to isolate analog circuits from digital circuits in mixed-signal systems. For example, two circuits 26A, 26B may be electronically coupled to different patches 22A, 22B in order to reduce noise coupling between the two circuits 26A, 26B. The first circuit 26A may be an analog circuit and the second circuit 26B may be a digital circuit. The first circuit 26A may be coupled to the first conductive layer 14 (the ground layer in this example) and to a first patch 22A in the periodically patterned region of the second conductive layer 20 (the power layer in this example). The second circuit 26B may be coupled to the first conductive (ground) layer 14, but to a second patch 22B separated from the first patch 22A of the second conductive layer 20. Noise coupling is minimized by virtue of the first and second circuits 26A, 26B being coupled to separate patches 22A, 22B. The LPF characteristics of the EBG structure 10 significantly attenuate the transmitted frequencies in the range of the bandgap associated with the LC network, so that the circuit 26A on the patch 22A is at least partially shielded from noise generated by the circuit 26B on the other patch 22B, and vice-versa.

Figure 3:
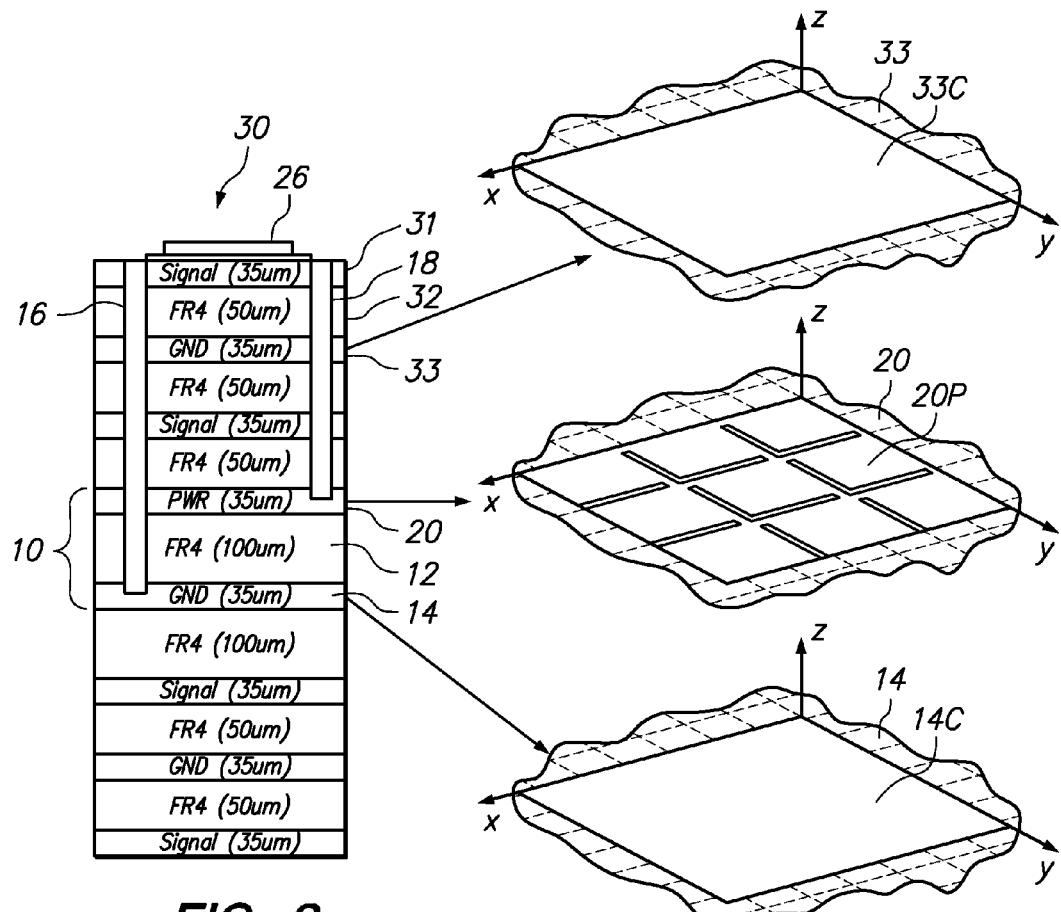
FIG. 3 is a cross-sectional view of a hypothetical PCB incorporating the EBG structure and a third conductive layer also having a substantially continuous region.

FIG. 3 is a cross-sectional view of a hypothetical PCB 30 incorporating the EBG structure 10 among the multiple layers of the PCB 30. In addition to the three layers 12, 14, 20 of the EBG structure 10, the PCB 30 includes multiple 35 μm signal layer 31, additional GND layers 33, and FR-4 dielectric layers 32 of various thicknesses. A circuit 26 (e.g. an analog or digital circuit) is mounted on an uppermost signal layer 31. The circuit 26 is coupled by a via 16 to the first conductive layer 14, which in this case is a ground layer ("GND"). The circuit 26 is coupled by another via 18 to the second conductive layer 20, which in this case is the power layer ("PWR"). Additional circuits (not shown) may be provided on the PCB 30, and connected by vias to the second conductive (PWR) layer 20 and to any one of the GND layers such as the ground layers 14 in the EBG structure 10 or the additional ground layers 33 in the PCB 30.

Figure 4:
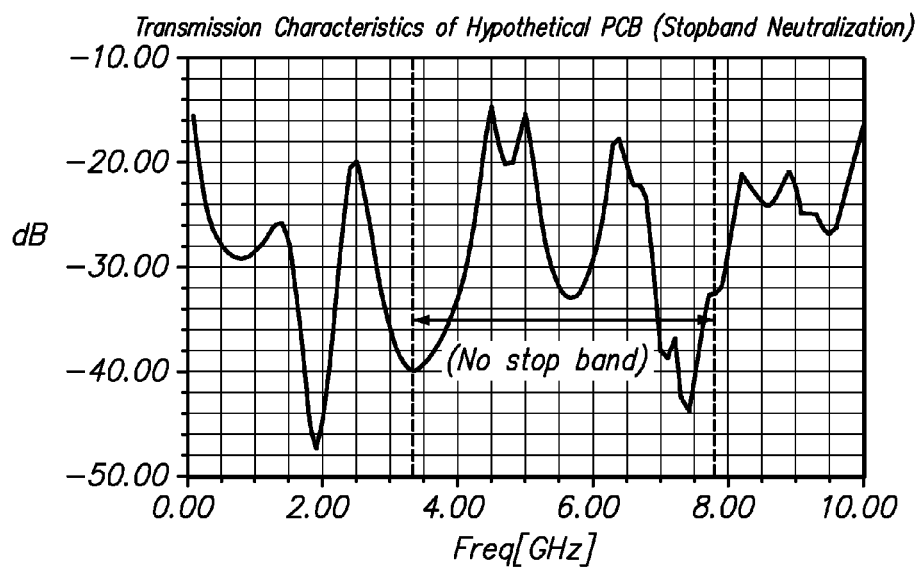
FIG. 4 is a graph of the transmission characteristic of the hypothetical PCB in FIG. 3, which includes stopband neutralization

An isometric view of selected layers is provided in FIG. 3 showing the general alignment of a continuous region 14C in the first conductive layer 14, a periodically patterned region 20P of the second conductive layer 20, and a continuous region 33C of a third conductive layer 33 (another GND layer). The two continuous regions 14C and 33C are typically solid metal regions of the respective first and third conductive layers 14, 33. The two continuous regions 14C and 33C are both in alignment with the periodically patterned region 20P of the second conductive layer 20. The effect of having the two continuous regions 14C and 33C adjacent to opposites sides of the periodically patterned region 20P is to neutralize the stopband that would otherwise be provided by just the EBG structure 10 alone. FIG. 4 is a graph showing the transmission characteristic of the hypothetical PCB 30, which illustrates this stopband neutralization.

Figure 5:
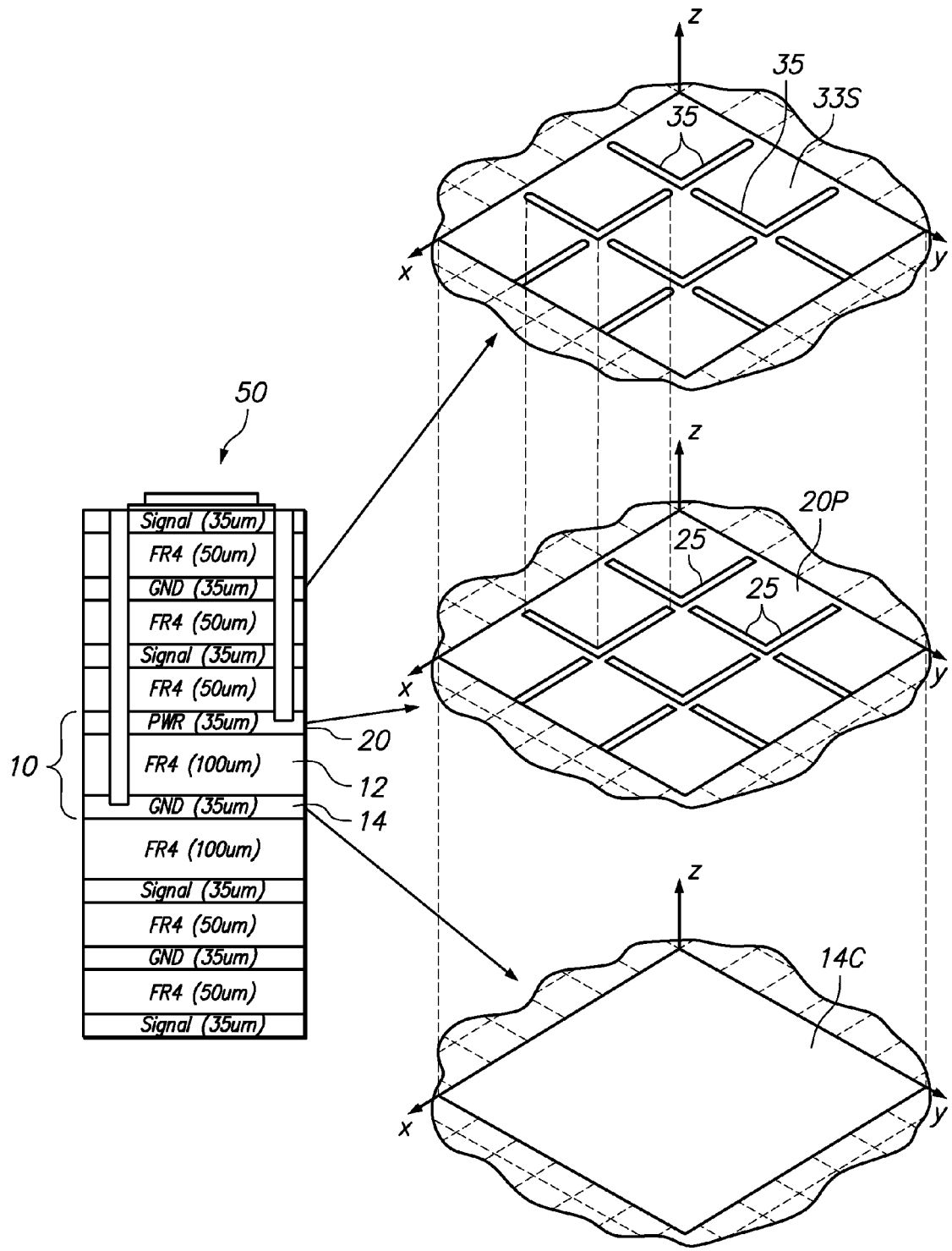
FIG. 5 is a cross-sectional view of a PCB according to an embodiment of the invention that includes a slotted region in the third conductive layer to preserve the stopband.

FIG. 5 is a cross-sectional view of a PCB 50 according to an embodiment of the invention that preserves the stopband of the EBG structure 10. The layers of the PCB 50 are similar to the layers of the hypothetical PCB 30 in FIG. 3, including the multiple signal layer 31, GND layers 33, and FR-4 dielectric layers 32. The circuit 26 is still disposed on the uppermost signal layer 31 and coupled by a via 16 to the first conductive layer 14 and coupled by the via 18 to the second conductive layer 20. However, the continuous region 14C of the first conductive layer and the periodically patterned region 20P of the second conductive layer 20 are now aligned with a slotted region 33S of the third conductive layer 33 (instead of a continuous region). Slots 35 in the slotted region 33S are aligned with openings 25 in the periodically patterned region 20P. The slotted region 33S may be formed, for example, by etching the slots 35 in the continuous region 33C of FIG. 3. The presence of the slots 35 preserves the stopband that would otherwise be neutralized or diminished if the periodically patterned region 20P were instead disposed between the two continuous regions 14C, 33C in the hypothetical PCB 30 of FIG. 3.

Figure 6:
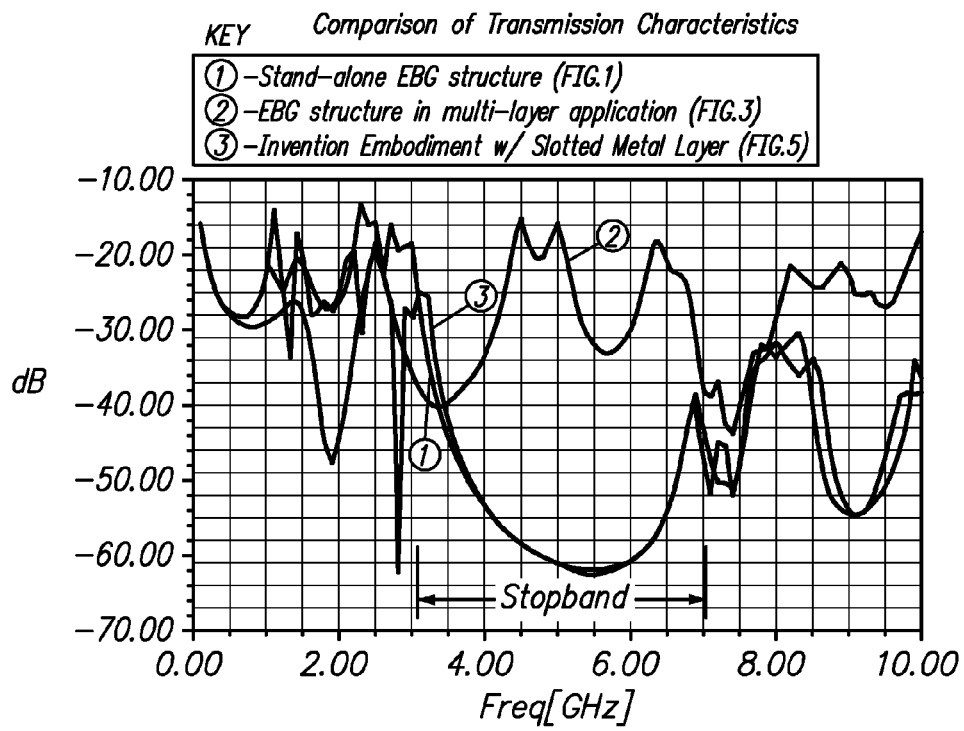
FIG. 6 is a graph comparing the transmission characteristics of the standalone EBG structure of FIG. 1, the hypothetical PCB of FIG. 3, and the PCB of FIG. 5.

FIG. 6 is a graph comparing the transmission characteristics of the standalone EBG structure of FIG. 1, the hypothetical PCB 30 of FIG. 3, and the PCB 50 of FIG. 5. The juxtaposition of the transmission characteristics illustrates the similarity between the stopband characteristics of the PCB 50 and the standalone EBG structure 10, in contrast with the stopband neutralization in the hypothetical PCB 30 of FIG. 3. The curve for the hypothetical EBG structure 30 does not have the stopband, due to the presence of a continuous conductive layer in planes on opposing sides of the periodically patterned region. However, the two curves for the standalone EBG structure 10 and the PCB 50 closely overlap in the region of about 3.3 to 7.8 GHz, indicating that the stopband of the EBG structure 10 is preserved when included in the PCB 50.

Figure 7:
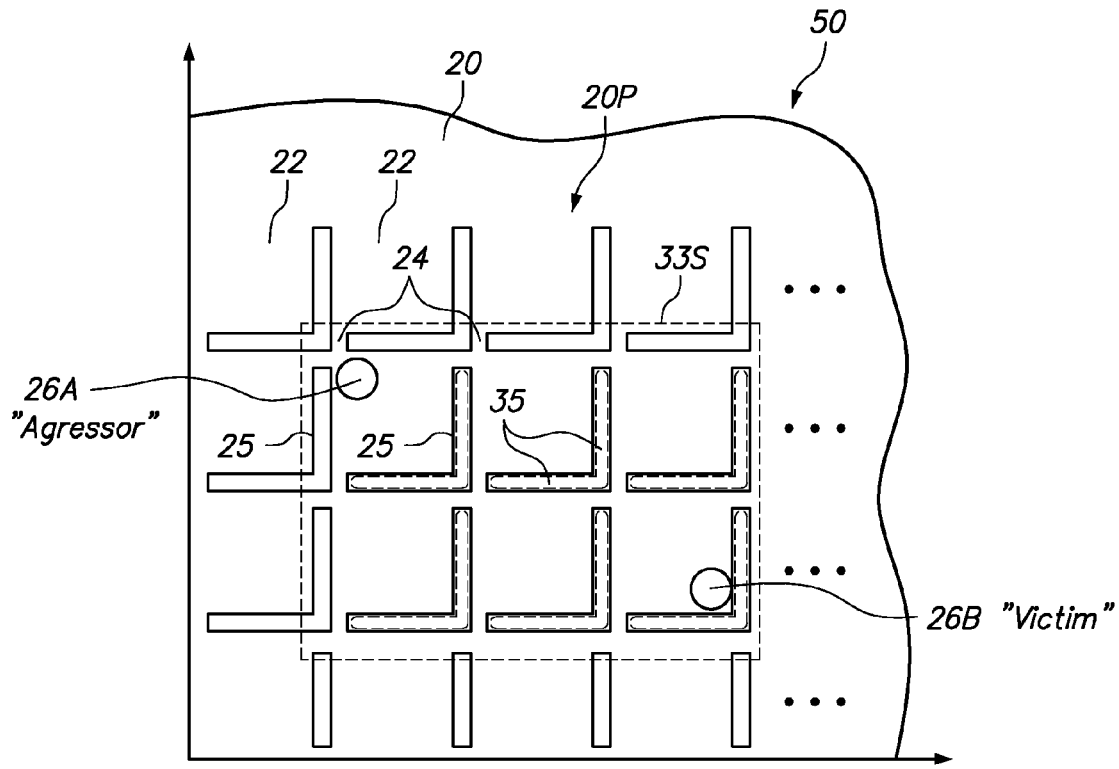
FIG. 7 is a plan view of selected layers of the PCB, with the slotted region of the third conductive layer projected onto the periodically patterned region of the second conductive layer.

FIG. 7 is a plan view of selected layers of the PCB 50, with the slotted region 33S of the third conductive layer 33 projected onto the periodically patterned region 20P of the second conductive layer 20. Although the shape, size, and location of patches and branches may vary among periodically patterned structures in different embodiments, the pattern of the patches 22 and location of the branches 24 near the corners of the patches 22 in the embodiment of FIG. 5 result in the openings 25 in the periodically patterned region 20P being L-shaped. Thus, pairs of the slots 35 in the slotted region 33S meet at right angles to form an L-shape generally aligned with the openings 25 in the periodically patterned region 20P.

The stopband will be best preserved if the pattern of the slotted region 35 within the plane of the third conductive layer 33S is a mirror image of the periodically patterned region 20P of the second conductive layer 20. However, the stopband may be preserved by the slotted region 33S despite slight differences that may occur between the shape of the openings 25 or imperfect alignment of the slots 35 with the openings 25. For example, the ends of the slots 35 are slightly rounded and the ends of the openings 25 are squared. However, even though the slotted region 33S in this embodiment is not a perfect mirror image of the portion of the periodically patterned region 20P below it, the slots 35 are still sufficiently similar in shape to and aligned with the openings 25 to preserve the stopband provided by the EBG structure.

It may also be observed from FIG. 7 that the slotted region 33S of the third conductive layer 33 spans only a portion of the periodically patterned region 20P of the second conductive layer 20. While it would be acceptable for the slotted region 33S and periodically patterned region 20P to have the same span, the span of the slotted region 33S in this embodiment has been selected with regard to the positioning of the two circuits 26A, 26B that have been targeted for filtering. Assuming the circuit 26A is a noisy digital circuit (the "aggressor") and the circuit 26B is a sensitive analog circuit (the "victim"), the span of the slotted region 33S has been selected to target those particular circuits 26A, 26B, to selectively provide noise filtering between the circuits 26A, 26B. One or more additional slotted regions (not shown) may be provided in the same plane as the slotted region 33S, either opposite and within the span of the periodically patterned region 20P or opposite and within the span of another periodically patterned region, to selectively target other groups of two or more circuits located elsewhere in the PCB. Such selective positioning of the slotted regions reduces the number of slots to be formed in the slotted layer, which potentially reduces the time and expense involved in manufacturing the PCB 50.

Figure 8:
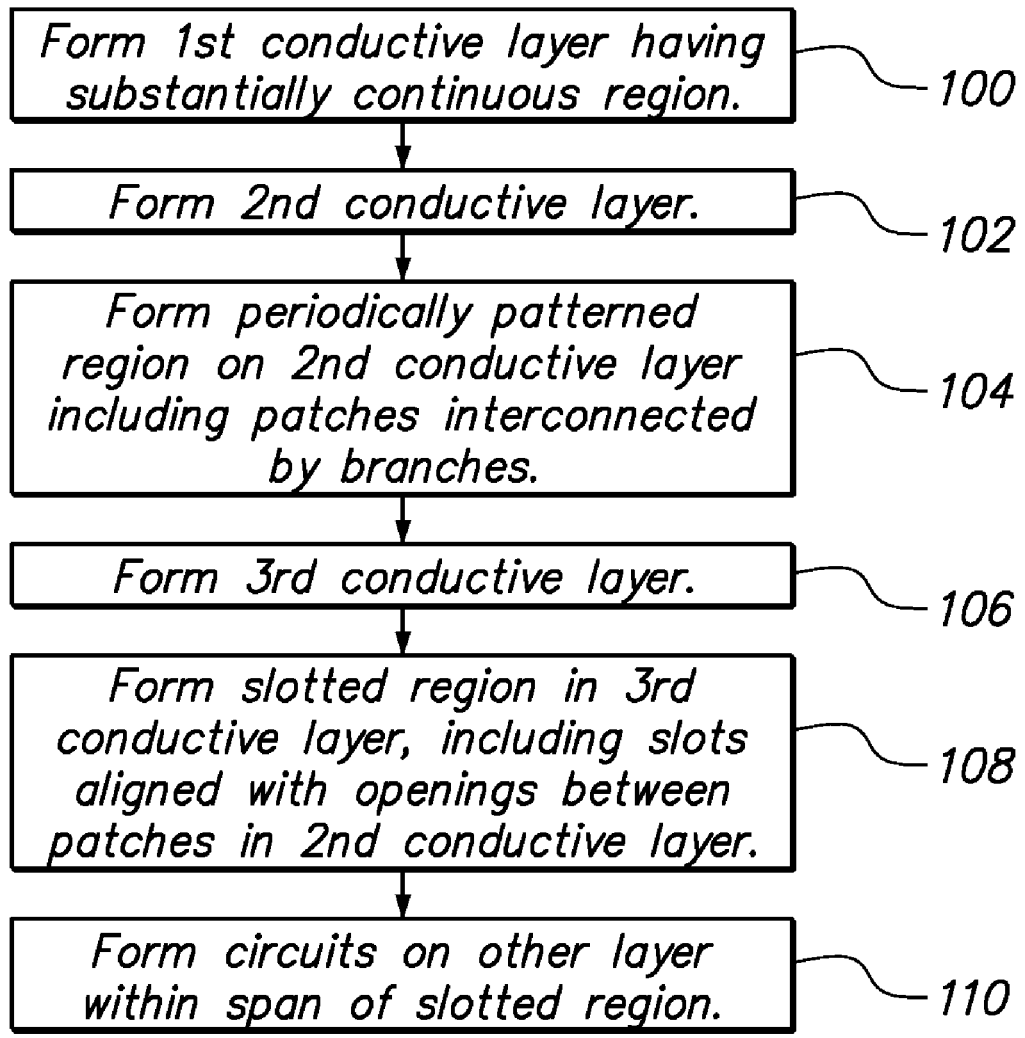
FIG. 8 is a flowchart outlining a method of forming a printed circuit board according to an embodiment of the invention.

FIG. 8 is a flowchart outlining a method of forming a printed circuit board according to an embodiment of the invention. While the description of the flowchart generalizing summarizes the steps of the method, additional details regarding the individual steps may be informed by reference to the preceding discussion of system and figures. In step 100, a first conductive layer is formed having a substantially continuous region. The first conductive layer may be formed, for example, in a ground plane of the PCB. In step 102, a second conductive layer is formed. The second conductive layer may be formed, for example, in a power plane of the PCB. A dielectric layer is typically provided between the first and second conductive layers. In step 104, a periodically patterned region is formed in the second conductive layer, including an array of patches interconnected by branches. The periodically patterned region may be formed, for example, by etching. Together, the continuous region of the first conductive layer and the periodically patterned region of the second conductive layer form an electromagnetic bandgap structure having a characteristic stopband between patches.

A third conductive layer is formed in step 106. The third conductive layer may initially be formed as a solid metal layer, for example. If the region of the third conductive layer opposite the periodically patterned region of the second conductive layer were continuous, however, the stopband of the EBG structure would likely be diminished or neutralized. Thus, to preserve the stopband, a slotted region is formed in the third conductive layer according to step 108. The slotted region includes slots aligned with openings between the patches in the second conductive layer. The stopband is preserved, at least within the span of the slotted region. According to step 110, circuits are formed on another layer of the PCB within the span of the slotted region. For example, within the span of the slotted region, at least one aggressor circuit (e.g. a noisy digital circuit) and at least one victim circuit (e.g. a sensitive analog circuit) may be formed. The aggressor circuit may be powered by coupling the aggressor circuit to one of the patches in the second conductive layer (in the power plane) and to the first conductive layer (in the ground plane). The victim circuit may be powered by coupling the victim circuit to another one of the patches and to the first conductive layer. Noise interference will be diminished by the stopband provided by the EBG structure, which has been preserved in the vicinity of the aggressor/victim circuits by virtue of the slotted region in the third conductive plane.

The illustrated embodiments are directed to electromagnetic bandgap structures. However, one skilled in the art will appreciate that the principles discussed with respect to the exemplary embodiments presented herein may be adapted to alternative types of bandgap structures, such as photonic bandgap structures.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, components and/or groups, but do not preclude the presence or addition of one or more other features, integers, steps, operations, elements, components, and/or groups thereof. The terms "preferably," "preferred," "prefer," "optionally," "may," and similar terms are used to indicate that an item, condition or step being referred to is an optional (not required) feature of the invention.

The corresponding structures, materials, acts, and equivalents of all means or steps plus function elements in the claims below are intended to include any structure, material, or act for performing the function in combination with other claimed elements as specifically claimed. The description of the present invention has been presented for purposes of illustration and description, but it not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A multi-layer circuit board, comprising:
a first conductive layer having a substantially continuous region;
a second conductive layer spaced from the first conductive layer with a dielectric material between the first and second conductive layers, the second conductive layer having a periodically patterned region including a plurality of spaced-apart conductive patches interconnected by conductive branches, the substantially continuous region of the first layer spanning at least the periodically patterned region of the second layer; and
a third conductive layer spaced from the second conductive layer in a direction away from the first conductive layer with a dielectric material between the second and third conductive layers, the third conductive layer having a slotted region including slots aligned with spaces between the patches in the periodically patterned region, wherein the first and third conductive layers are the nearest conductive layers on either side of the second conductive layer.

2. The multi-layer circuit board of claim 1, wherein one of the first and second conductive layers is a power layer and the other of the first and second conductive layers is a ground layer.

3. The multi-layer circuit board of claim 2, wherein the third conductive layer is another ground layer or another power layer.

4. The multi-layer circuit board of claim 2, further comprising an outer layer having a plurality of circuits formed thereon, each circuit being coupled by vias to the power layer and to the ground layer.

5. The multi-layer circuit board of claim 2, further comprising one or more additional ground layers.

6. The multi-layer circuit board of claim 1, wherein the slotted region spans a smaller area than the patterned region.

7. The multi-layer circuit board of claim 6, further comprising aggressor and victim circuits disposed on another layer within the span of the slotted region.

8. The multi-layer circuit board of claim 1, wherein the slotted region of the third conductive layer substantially mirrors the periodically patterned region of the second conductive layer.

9. The multi-layer circuit board of claim 1, wherein the conductive patches are arranged in a rectangular array with substantially evenly-spaced patches.

10. The multi-layer circuit board of claim 1, wherein the substantially continuous region is a solid metal region.

11. The multi-layer circuit board of claim 1, wherein one or more of the first, second, and third conductive layers comprise a homogenous metal or metal alloy.

12. A method of forming a multi-layer circuit board, comprising:
forming a first conductive layer including a substantially continuous region;
forming a second conductive layer spaced from the first conductive layer;
forming a periodically patterned region on the second conductive layer including a plurality of spaced-apart conductive patches interconnected by conductive branches and spanning at least the substantially continuous region of the first layer;
forming a third conductive layer spaced from the second conductive layer in a direction away from the first conductive layer;
forming a slotted region in the third conductive layer, including slots aligned with spaces between the patches in the periodically patterned region of the second layer, the periodically patterned region of the second layer spanning at least the slotted region of the third layer; and
forming the layers of the multi-layer circuit board such that the first and third conductive layers are the nearest conductive layers on either side of the second conductive layer.

13. The method of claim 12, further comprising:
forming the second conductive layer as a solid metal layer; and forming the periodically patterned region of the second conductive layer by etching the spaced-apart conductive patches interconnected by conductive branches in the solid metal layer.

14. The method of claim 12, further comprising:
forming the third conductive layer as a solid metal layer; and
forming the slots in the third conductive layer by etching the slots in the solid metal layer at the selected locations.

15. The method of claim 12, further comprising:
forming a plurality of circuits on another layer spaced from the first and second layers and within the span of the periodically patterned region of the second layer;
selecting an aggressor circuit and a victim circuit from among the plurality of circuits; and
forming the slotted region such that the slotted region spans at least the aggressor circuit and the victim circuit.

16. The method of claim 15, further comprising:
forming one of the first and second conductive layers in a ground plane;
forming the other of the first and second conductive layers in a power plane; and
coupling each circuit to the first and second conductive layers.

17. The method of claim 12, further comprising:
forming the patterned region with a larger span than the slotted region.

18. The method of claim 12, further comprising forming the slotted region as a substantial mirror image of the portion of the periodically patterned region opposite the slotted region.

* * * * *